United States Patent
Hsu

(10) Patent No.: US 6,313,661 B1
(45) Date of Patent: Nov. 6, 2001

(54) HIGH VOLTAGE TOLERANT I/O BUFFER

(75) Inventor: Jen-Tai Hsu, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/540,395

(22) Filed: Mar. 31, 2000

(51) Int. Cl.[7] .............................................. H03K 19/0175
(52) U.S. Cl. ........................... 326/81; 326/83; 326/113; 326/86; 326/56
(58) Field of Search ................................ 326/56, 57, 80, 326/81, 83, 86, 113

(56) References Cited

U.S. PATENT DOCUMENTS

| | | |
|---|---|---|
| 5,381,061 | 1/1995 | Davis . |
| 5,570,043 * | 10/1996 | Churchill ................................ 326/81 |
| 5,576,635 * | 11/1996 | Partovi et al. .......................... 326/27 |
| 5,661,414 | 8/1997 | Shigehara et al. . |
| 5,764,077 * | 6/1998 | Andresen et al. ...................... 326/34 |
| 5,864,243 * | 1/1999 | Chen et al. ............................. 326/58 |
| 5,892,377 | 4/1999 | Johnston et al. . |
| 6,084,431 * | 7/2000 | Shigehara et al. ..................... 326/81 |

FOREIGN PATENT DOCUMENTS

06140911-A * 5/1994 (JP) ........................................ 326/57

* cited by examiner

Primary Examiner—Michael Tokar
Assistant Examiner—Steven S. Paik
(74) Attorney, Agent, or Firm—Blakely, Sokoloff, Taylor & Zafman LLP

(57) ABSTRACT

An input/output (I/O) buffer having an output node tolerant of an externally applied high voltage signal is powered by a lower voltage supply potential and comprises a n-well region and a bias generation circuit that generates a reference voltage at an internal node. A PMOS pull-up transistor is coupled between the lower voltage supply potential and the output node, and NMOS pull-down transistor is coupled between the output node and a ground reference potential. First and second PMOS charging transistors each of their gates coupled to the internal node, with the first PMOS charging transistor being coupled between the output node and the gate of the PMOS pull-up transistor. The second PMOS charging transistor is coupled between the output node and the n-well region. The first and second charging transistors operate to pass a pad voltage applied to the output node to the gate of the PMOS pull-up transistor and the n-well region, respectively, when the pad voltage reaches or exceeds the lower voltage supply potential.

22 Claims, 2 Drawing Sheets

HIGH VOLTAGE TOLERANT I/O BUFFER

FIELD OF THE INVENTION

The present invention relates generally to the field of integrated circuitry; more particularly, to interface circuits useful for transmitting signals between an integrated circuit (IC) and an external bus, circuit or system.

BACKGROUND OF THE INVENTION

Input/output (I/O) buffer circuits are generally well known in the semiconductor and computer arts. Early semiconductor processes were designed to operate in the voltage range of zero to five volts. In recent years, a new low voltage integrated circuit standard based on a 3.3-volt nominal power supply has become prevalent in semiconductor devices. Since the trend toward reduced power consumption devices will surely continue, is likely that future integrated circuits will be based on an even lower supply voltage standard (e.g., 1.8 volts). As one might expect, problems arise when lower voltage integrated circuits interface with legacy buses and older devices that operate with higher supply voltage potentials.

Modem complementary metal-oxide semiconductor (CMOS) technologies frequently operate between the power supply voltage ($V_{CC}$) of 3.3 volts and ground ($V_{SS}$). In CMOS technology, PMOS transistors are fabricated with p-type source and drain regions formed in an n-type well region. The n-type well region is normally disposed in a p-type semiconductor substrate. NMOS transistors are fabricated with n-type source and drain regions formed in the p-type substrate. These two different regions for PMOS and NMOS transistor formation are illustrated in FIG. 1. By way of example, FIG. 1 shows N-well 12 formed in P-substrate 11. In CMOS digital systems, I/O buffers are often designed to operate in mixed voltage environments. For example, in a typical computer system the central processor, I/O controller, or other chips may communicate with an assortment of peripheral devices via a Peripheral Component Interconnect (PCI) bus. FIG. 2 illustrates such a mixed voltage system comprising a processor 20 that includes I/O buffer circuitry 22 connected to bus 25. In this system, integrated circuits with 5V and 3.3V driving capabilities are commonly coupled to the PCI bus.

Two types of operations are commonly encountered in systems such as that shown in FIG. 2. The first operation arises when the driver is required to drive a high voltage (5V) onto the bus. The second type of operation is where the driver has to tolerate a high voltage ($V_{BUS}$=5V), but drives only a lower voltage ($V_{CC}$=3.3V) at its output node ($V_{PAD}$). In the case where the driver must tolerate a high input voltage but only drives a lower output voltage, a number of detrimental effects can occur. First, the PN junction formed by the p-type drain region and the N-well region associated with the lower voltage (3.3V) driver PMOS pull-up transistor can become forward biased. This happens when the output pad of the buffer, which is connected to the drain of the PMOS pull-up transistor, experiences a high voltage (5V) signal applied from the common external bus. With the PN junction forward biased, a low impedance path is created from the high voltage external bus ($V_{BUS}$=5V) to the internal lower voltage power supply rail ($V_{CC}$=3.3V). Additionally, the high voltage applied to the output pad of the buffer can cause electrical stress damage to various internal nodes of the lower voltage driver circuit. For obvious reasons, it is desirable to eliminate both of these harmful effects.

One prior art approach described in U.S. Pat. No. 5,892,377 teaches a high voltage tolerant buffer circuit that utilizes an additional high-voltage supply (e.g., 5V). The additional supply line is provided on-chip to bias the N-well of the pull-up PMOS output drivers. Since the N-well is typically hard wired to a signal ($V_{BUS}$) having a voltage that is higher than $V_{CC}$, body effects may be introduced that raise the therehold voltage ($|V_{TP}|$) of the PMOS transistors. This, in turn, reduces the strength of the PMOS driver, which means that a much larger PMOS device size must be utilized as compensation. Besides the area penalty of a larger PMOS transistor, a major drawback of this approach is the requirement for an additional internal high-voltage supply.

There have been several attempts to design a high voltage tolerant buffer circuit that operates from a single supply. One notable example is disclosed in U.S. Pat. No. 5,381,061, which teaches the use of a high potential level pseudorail coupled at the N-well of the PMOS output pull-up transistor. The problem with this, and similar designs, is the creation of a so-called "dead zone" associated with the input voltage range between $V_{CC}-|V_{TP}|$ and $V_{CC}+|V_{TP}|$. Within this range, the buffer does not function properly; that is, a leakage path exists between the output node ($V_{PAD}$) and $V_{CC}$.

U.S. Pat. No. 5,661,414 discloses a circuit solution to the "dead zone" problem. However, this solution requires a large, complicated circuit that occupies a significant amount of extra silicon area.

Therefore, what is needed is a circuit solution that overcomes the foregoing detrimental problems and which does not require an additional high voltage power supply and which is not unduly costly in terms of silicon area.

SUMMARY OF THE INVENTION

The present invention comprises an input/output (I/O) buffer circuit having an output node tolerant of an externally applied high voltage signal. The I/O buffer circuit is powered by a lower voltage supply potential and comprises a n-well region associated with PMOS transistors. A bias generation circuit generates a reference voltage at an internal node of the I/O buffer circuit. A PMOS pull-up transistor is coupled between the lower voltage supply potential and the output node. A NMOS pull-down transistor is coupled between the output node and a ground reference potential. In addition, first and second PMOS charging transistors are included, each of the first and second PMOS charging transistors having its gate coupled to the internal node. The first PMOS charging transistor is coupled between the output node and the gate of the PMOS pull-up transistor, and the second PMOS charging transistor is coupled between the output node and the n-well region.

BRIEF DESCRIPTION OF THE DRAWINGS

The present invention will be understood more fully from the detailed description which follows and from the accompanying drawings, which however, should not be taken to limit the invention to the specific embodiments shown, but are for explanation and understanding only.

DETAILED DESCRIPTION

A single supply, high voltage tolerant I/O buffer is described. In the following description, numerous specific details are set forth, such as device types, circuit configurations, voltage levels, etc., in order to provide a thorough understanding of the invention. It will be obvious, however, to one skilled in the art, that these specific details may not be needed to practice the present invention.

Figure 1:
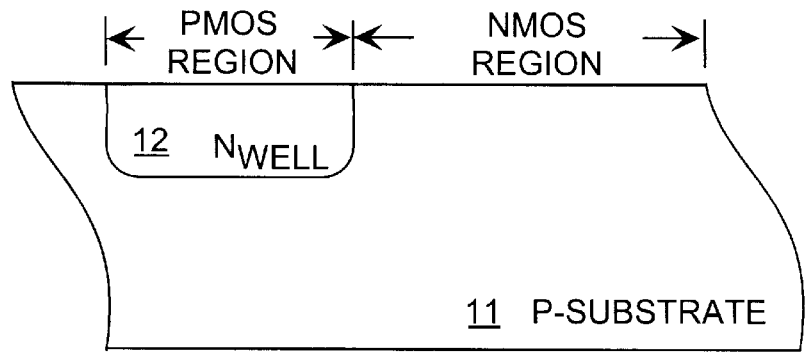
FIG. 1 is a cross-sectional view of a semiconductor substrate showing formation of PMOS and NMOS device regions.
Figure 2:
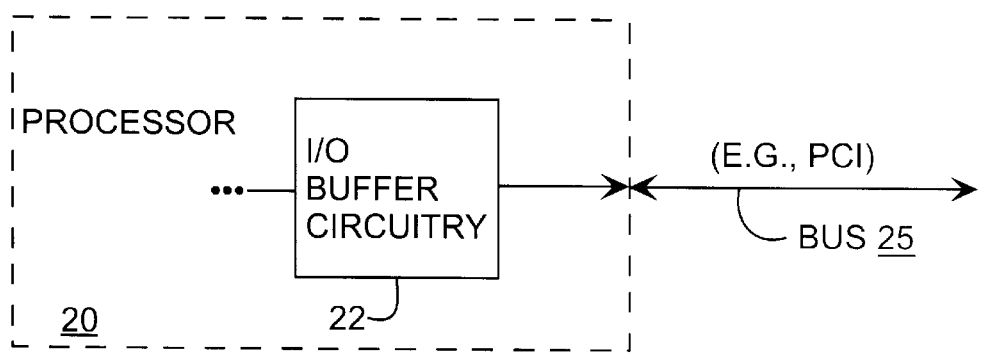
FIG. 2 is an example of system that includes a high voltage tolerant I/O buffer in accordance with one embodiment of the present invention.
Figure 3:
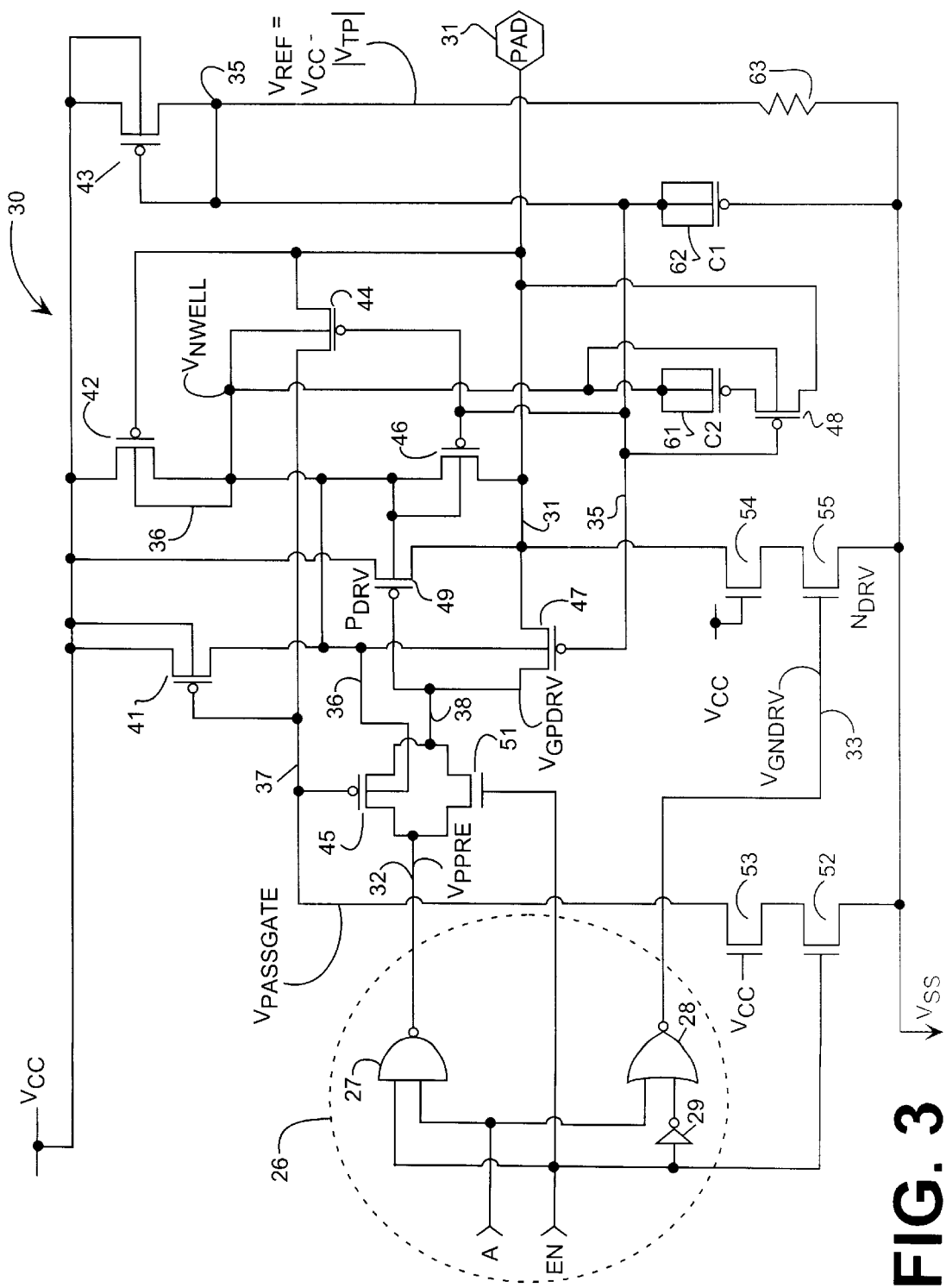
FIG. 3 is a circuit schematic diagram illustrating one embodiment of the present invention.

Referring to FIG. 3, there is shown a circuit schematic diagram of one embodiment of the present invention. The high voltage tolerant buffer circuit 30 comprises a PMOS pull-up transistor 49 ($P_{DRV}$) coupled between $V_{CC}$ and output node 31 ($V_{PAD}$). The gate of transistor 49 is connected to internal node 38. A NMOS pull-down transistor 55 ($N_{DRV}$) is coupled in series with NMOS device 54 between output node 31 and the ground reference potential $V_{SS}$. NMOS device 54, which has its gate connected to $V_{CC}$, is included to guard against overstressing transistor 55. (Transistor 53 also performs the same function with respect to NMOS transistor 52.)

The gate of NMOS transistor 55 is coupled to the output of NOR gate 28. NOR gate 28, NAND gate 27, and inverter 29 comprise the predriver logic 26 that provides input signals to buffer circuit 30. Note that the output of NAND gate 27 is coupled to internal node 38 through a transmission gate consisting of parallelconnected transistors 45 and 51. The gate of PMOS transistor 45 is coupled to node 37 ($V_{PASSGATE}$) whereas the gate of NMOS transistor 51 is coupled directly to the enable input signal (EN). NMOS transistors 53 and 52 are coupled in series between node 37 and $V_{SS}$, with the gate of transistor 52 being connected to EN.

This circuit configuration permits the input logic signal (A) to be passed to the gate of the PDRV transistor 49 (node 38) whenever the enable input signal is active high. This is referred to as the buffer-enabling or active mode of operation. Conversely, when EN is low, the transmission gate becomes non-conductive, isolating node 38 from the input driver logic signal. When EN is low, buffer circuit 30 operates in a tri-state mode. The performance of I/O buffer circuit 30 in both the buffer-enabling and tri-state modes will be described in more detail shortly.

One of the key features of circuit 30 is a bias generation circuit for producing a stable reference voltage ($V_{REF}=V_{CC}-|V_{TP}|$) at node 35. The bias generation circuit comprises PMOS transistors 43 & 62 and resistor 63. Resistor 63 is coupled between node 35 and $V_{SS}$. (Practitioners in the art will appreciate that resistor 63 could be implemented by a diode-connected PMOS device to save chip area.) The reference voltage provided at node 35 is connected to the gates of PMOS transistors 44, 46, 47 and 48. PMOS transistors 44, 46 and 47 are coupled between node 31 and respective nodes 37, 36 and 38. The reference voltage is generated by the connection of PMOS transistor 43 between $V_{CC}$ and node 35, with the gate of transistor 43 also being connected to node 35; this sets the reference voltage at node 35 to be equal to $V_{CC}$ minus $|V_{TP}|$.

PMOS transistor 62 is connected so as to function as a capacitor C1 between node 35 and $V_{SS}$. Capacitor C1 adds stability to node 35, as the Miller capacitance associated with the PMOS devices could cause the voltage on node 35 to vary with changes in the applied pad voltage.

The bias generation circuit allows the externally applied voltage to be passed from the bus (or other device connection) at node 31 ($V_{PAD}$) to all critical internal nodes (36–38) as soon as the pad voltage reaches $V_{CC}$. This feature advantageously solves the "dead zone" (i.e., $V_{CC}<V_{PAD}<V_{CC}+|V_{TP}|$) problem inherent in past designs. In other words, when $V_{PAD} \geq V_{CC}$ all of the PN junctions between the p-type drain regions and N-well associated with transistors 44 and 46–49 will be non-conductive (i.e., "off").

The other devices in buffer circuit 30 include PMOS transistors 48 and 61 configured to function as an A.C. boost circuit for situations where $V_{PAD}$ rises rapidly. PMOS transistor 48 is coupled between the gate of transistor 61 and output node The gate of transistor 48 is connected to reference voltage node 35. PMOS transistor 61 is connected as a capacitor (C2) between transistor 48 and node 36 ($V_{NWELL}$). When buffer 30 quickly transitions from the active or enabled mode to the tri-state mode of operation, a rapid positive-going transition occurs at output node 31 (i.e., $V_{PAD}>V_{CC}$). When this happens, an A.C. displacement current flows from the pad to through transistor 48 and capacitor C2 to rapidly charge the N-well associated with the PMOS transistors. It is appreciated that this boost feature is most beneficial when buffer circuit 30 is connected to a very high-speed bus.

PMOS transistors 41 and 42 complete the high voltage tolerant buffer circuit 30 of FIG. 3. Both transistors 41 and 42 are coupled between $V_{CC}$ and node 36 ($V_{NWELL}$). The gate of PMOS transistor 41 is coupled to node 37 ($V_{PASSGATE}$) while the gate of transistor 42 is connected to output node 31 ($V_{PAD}$). As discussed previously, node 37 coupled to the gate of transistor 41 is controlled by the enable input EN. When EN is high (logical "1") the gate of transistor 41 is low (logical "0") and transistor 41 connects $V_{CC}$ to node 36 ($V_{NWELL}$). Thus, when the buffer transitions from a tri-state mode to an active mode of operation (for example, node 31 $V_{PAD}=5V\rightarrow 3.3V$) the N-well voltage is quickly neutralized to the $V_{CC}$ supply line voltage.

PMOS transistor 42 essentially serves the same purpose for the opposite transition (from active mode to tri-state mode of operation). That is, when $V_{PAD}$ begins to exceed $V_{CC}$, transistor 42 becomes non-conductive, effectively isolating $V_{CC}$ from $V_{NWELL}$.

To better understand the operation of I/O buffer circuit 30, first consider the situation where the circuit operates in the active mode. In this case, $EN=V_{CC}$, so $V_{PASSGATE}=V_{SS}=0V$ through the conduction of NMOS transistors 52 & 53. With node 37=0V, PMOS transistor 41 is turned on, which pulls node 36 ($V_{NWELL}$) UP to $V_{CC}$. Since $V_{NWELL}=V_{CC}$, the circuit does not suffer from any possible body effect associated with pull-up driver transistor 49. Also, the transmission gate transistors 45 and 51 are enabled to pass the input logic signal from the predriver circuitry to node 38 for controlling the gate of pull-up transistor 40.

In the tri-state mode EN=0V, so NMOS transistor 52 is off and the output of gate 27 is at $V_{CC}$. However, node 37 ($V_{PASSGATE}$) initially remains at 0V, so PMOS transistor 45 is capable of passing $V_{CC}$ to node 38 to shut off $P_{DRV}$ transistor 49. It should be understood that node 38 can maintain a $V_{CC}$ voltage level even with $V_{PAD}<V_{CC}$ for an extended time.

Of course, during tri-state mode other integrated circuits sharing the common bus may be driving output node 31. If a high-voltage driving chip is driving the bus then the externally applied voltage at node 31 can rise well above $V_{CC}$. When $V_{PAD} \geq V_{CC}$, PMOS transistors 44, 46, 47, and 48 are turned on. With each of transistors 44, 46, 47, and 48 conducting, nodes 36 ($V_{NWELL}$), 37 ($V_{PASSGATE}$), and 38 (gate of $P_{DRV}$) all follow the voltage at node 31, $V_{PAD}$. Capacitor C2 (e.g., transistor 61) ensures that $V_{NWELL}$ can track $V_{PAD}$ even when an extremely high slew rate signal is present at node 31. In other words, the combination of transistor 48 and capacitor C2 act to effectively speed up the charging of $V_{NWELL}$. Note that in the active mode, PMOS transistor 48 functions as an "off" switch to disable the capacitor-coupling charge path.

With internal node 38 charged to $V_{PAD}$ whenever $V_{PAD} \geq V_{CC}$, PMOS pull-up transistor is off. Furthermore, since $V_{NWELL}$ is also charged to $V_{PAD}$ when $V_{PAD} \geq V_{CC}$, all of the PN junctions between the p-type drain and n-type well regions associated with transistors 44, and 46–49 are off. Since $V_{PASSGATE}$ tracks $V_{PAD}$ when $V_{PAD} \geq V_{CC}$, PMOS transistor 45 is off, which isolates the predriver input signal from $V_{PAD}$ at the gate of transistor 49.

NMOS transistor 42 ensures that $V_{NWELL}$ is maintained at $V_{CC}$ when $V_{PAD}$ drops below $V_{CC}$ (e.g., during a transition from tri-state mode to active mode of That is, transistor 42 begins conducting when $V_{PAD} < V_{CC}$, and thus keeps $V_{NWELL}$ at $V_{CC}$ level.

The following table summarizes the critical node voltages of circuit 30 for active and tri-state modes of operation.

| CIRCUIT NODE | MODE OF OPERATION | |
|---|---|---|
| | ENABLE | TRI-STATE |
| $V_{PPRE}$ (32) | $V_{PPRE}$ (switching) | $V_{CC}$ |
| $V_{GNDRV}$ (33) | $V_{GNDRV}$ (switching) | $V_{SS}$ |
| $V_{GPDRV}$ (38) | $V_{PPRE}$ (switching) | $V_{PAD}$, when $V_{PAD} \geq V_{CC}$ |
| | | $V_{CC}$, when $V_{PAD} < V_{CC}$ |
| $V_{PASSGATE}$ (37) | $V_{SS}$ | $V_{PAD}$, when $V_{PAD} \geq V_{CC}$ |
| | | $< V_{CC}$, when $V_{PAD} < V_{CC}$ |
| $V_{NWELL}$ (36) | $V_{CC}$ | $V_{PAD}$, when $V_{PAD} \geq V_{CC}$ |
| | | $V_{CC}$, when $V_{PAD} < V_{CC}$ |
| $V_{REF}$ (35) | $V_{CC} - |V_{TP}|$ | $V_{CC} - |V_{TP}|$ |

Practitioners in the art will appreciate that the present invention provides a great advantage over prior art designs that require the use of multiple power supply pins on a chip. The present invention is characterized by low leakage current across all input voltage ranges, and saves high-voltage pins and power routing as compared to previous high voltage tolerant buffer solutions. This can have a very significant impact for pad-limited integrated circuit designs and chipsets. Additionally, the present invention saves driver transistor area by avoiding body effects prevalent in certain prior art circuits.

I claim:

1. An input/output (I/O) buffer circuit comprising:
   an output node;
   an n-well region;
   a bias generation circuit that generates a reference voltage at an internal node;
   a PMOS pull-up transistor coupled between a first voltage supply potential and the output node;
   a NMOS pull-down transistor coupled between the output node and a ground reference potential;
   first and second PMOS charging transistors each having a gate coupled to the internal node, the first PMOS charging transistor being coupled between the output node and the gate of the PMOS pull-up transistor, the second PMOS charging transistor being coupled between the output node and the n-well region.

2. The I/O circuit of claim 1 further comprising passgate circuitry to isolate the PMOS pull-up transistor from an input signal node responsive to a first logic signal, and to isolate the input signal node from the output node when a pad voltage applied to the output node reaches the first voltage supply potential.

3. The I/O circuit of claim 2 wherein the passgate circuitry comprises an enable input node, application of the first logic signal to the enable input node causing the I/O circuit to operate in a first mode, and a second logic signal applied to the enable input node causing the I/O circuit to operate in a second mode.

4. The I/O circuit of claim 3 wherein the second mode is an active mode and the first mode is a tri-state mode of operation.

5. The I/O circuit of claim 1 wherein the first and second charging transistors operate to pass a pad voltage applied to the output node to the gate of the PMOS pull-up transistor and the n-well region, respectively, when the pad voltage reaches or exceeds the first voltage supply potential.

6. The I/O circuit of claim 4 wherein the first and second charging transistors further operate to hold the gate of the PMOS pull-up transistor and the n-well region at the first voltage supply potential when the pad voltage is less than the first voltage supply potential and the I/O circuit is in the tri-state mode of operation.

7. An input/output (I/O) buffer circuit comprising:
   an output node;
   an n-well region;
   a bias generation circuit that generates a reference voltage at an internal node;
   a PMOS pull-up transistor coupled between a first voltage supply potential ($V_{CC}$) and the output node;
   a NMOS pull-down transistor coupled between the output node and a ground reference potential ($V_{SS}$);
   first and second PMOS charging transistors each having a gate coupled to the internal node, the first PMOS charging transistor being coupled between the output node and the gate of the PMOS pull-up transistor, the second PMOS charging transistor being coupled between the output node and the n-well region, wherein the first and second charging transistors operate to pass a pad voltage applied to the output node to the gate of the PMOS pull-up transistor and the n-well region, respectively, when the pad voltage reaches or exceeds $V_{CC}$.

8. The I/O circuit of claim 7 wherein the reference voltage is equal to $V_{CC} - |V_{TP}|$ where $V_{TP}$ is a threshold voltage of a bias PMOS transistor.

9. The I/O circuit of claim 7 wherein the bias generator circuit comprises:
   a bias PMOS transistor coupled between $V_{CC}$ and the internal node, the gate of the bias PMOS transistor also being coupled to the internal node;
   a capacitor coupled between the internal node and $V_{SS}$; and
   a resistor coupled between the internal node and $V_{SS}$.

10. The I/O circuit of claim 9 wherein the reference voltage is equal to $V_{CC} - |V_{TP}|$ where $V_{TP}$ is a threshold voltage of the bias PMOS transistor.

11. The I/O circuit of claim 7 further comprising passgate circuitry to isolate the PMOS pull-up transistor from an input signal node responsive to a first logic signal, and to isolate the input signal node from the output node when the pad voltage applied to the output node reaches the first voltage supply potential.

12. The I/O circuit of claim 11 wherein the passgate circuitry comprises an enable input node, application of the first logic signal to the enable input node causing the I/O circuit to operate in a first mode, and a second logic signal applied to the enable input node causing the I/O circuit to operate in a second mode.

13. The I/O circuit of claim 12 further comprising a transition control circuit configured to isolate the n-well region from the first voltage supply potential when the I/O circuit transitions from the second mode to the first mode, and to connect the n-well region to the first voltage supply potential when the I/O circuit transitions from the first mode to the second mode.

14. The I/O circuit of claim 11 wherein the passgate circuitry comprises an enable input node, application of the first logic signal to the enable input node causing the I/O circuit to operate in a first mode, and a second logic signal applied to the enable input node causing the I/O circuit to operate in a second mode.

15. The I/O circuit of claim 14 wherein the second mode is an active mode and the first mode is a tri-state mode of operation.

16. The I/O circuit of claim 15 further comprising a transition control circuit to neutralize the n-well region to $V_{CC}$ when the I/O circuit transitions from the tri-state mode to the active mode of operation,
 a first control PMOS transistor coupled between $V_{CC}$ and the n-well region.

17. The I/O interface circuit of claim 16 wherein the transition control circuit also functions to isolate the n-well region from $V_{CC}$ when the I/O circuit transitions from the tri-state mode to the active mode of operation.

18. The I/O interface circuit of claim 17 wherein the transition control circuit comprises:
 a first control PMOS transistor coupled between $V_{CC}$ and the n-well region, the gate of the first control PMOS transistor being coupled to the enable input node such that the first control PMOS transistor conducts when the I/O circuit is in the active mode of operation; and
 a second control PMOS transistor coupled between $V_{CC}$ and the n-well region, the gate of the second control PMOS transistor being coupled to the output node such that the second control PMOS transistor becomes non-conductive when the pad voltage exceeds $V_{CC}$.

19. An input/output (I/O) buffer circuit comprising:
 an output node;
 an n-well region;
 a bias generation circuit that generates a reference voltage at an internal node;
 a PMOS pull-up transistor coupled between a first supply potential ($V_{CC}$) and the output node;
 a NMOS pull-down transistor coupled between the output node and a ground reference potential ($V_{SS}$);
 first and second PMOS charging transistors each having a gate coupled to the internal node, the first PMOS charging transistor being coupled between the output node and the gate of the PMOS pull-up transistor, the second PMOS charging transistor being coupled between the output node and the n-well region, wherein the first and second charging transistors operate to pass a pad voltage applied to the output node to the gate of the PMOS pull-up transistor and the n-well region, respectively, when the pad voltage reaches or exceeds $V_{CC}$;
 passgate circuitry to isolate the PMOS pull-up transistor from an input signal responsive to a first logic signal, and to isolate the input signal node from the output node when the pad voltage applied to the output node reaches or exceeds $V_{CC}$, the passgate circuitry comprising a transmission gate coupled between the input signal node and the gate of the PMOS pull-up transistor; and
 a boost circuit coupled to the internal node, the n-well region and the output node, the boost circuit causing a displacement current to flow from the output node to charge the n-well region in response to a rapid transition at the output node.

20. The I/O circuit of claim 19 wherein the bias generator circuit comprises:
 a bias PMOS transistor coupled between $V_{CC}$ and the internal node, the gate of the bias PMOS transistor also being coupled to the internal node;
 a capacitor coupled between the internal node and $V_{SS}$; and
 a resistor coupled between the internal node and $V_{SS}$.

21. The I/O circuit of claim 20 wherein the reference voltage is equal to $V_{CC}-|V_{TP}|$ where $V_{TP}$ is a threshold voltage of the bias PMOS transistor.

22. The I/O circuit of claim 19 wherein the boost circuit comprises:
 a capacitor having first and second terminals, the first terminal being coupled to the n-well region; and
 a boost PMOS transistor coupled between the second terminal of the capacitor and the output node, the gate of the boost PMOS transistor being coupled to the internal node.

* * * * *

UNITED STATES PATENT AND TRADEMARK OFFICE
CERTIFICATE OF CORRECTION

PATENT NO. : 6,313,661 B1
DATED : November 6, 2001
INVENTOR(S) : Hsu

It is certified that error appears in the above-identified patent and that said Letters Patent is hereby corrected as shown below:

Column 1,
Line 23, delete "Modem" and insert -- Modern --.

Column 2,
Line 6, delete "therehold voltage" and insert -- threshold voltage --.

Column 4,
Line 7, delete "output node The" and insert -- output node 31. The --.
Line 48, delete "pull-up transistor 40." and insert -- pull-up transistor 49. --.

Column 5,
Line 54, delete "a NMOS" and insert -- an NMOS --.

Column 6,
Line 28, delete "a NMOS" and insert -- an NMOS --.

Column 7,
Line 47, delete "a NMOS" and insert -- an NMOS --.

Signed and Sealed this

Twenty-ninth Day of October, 2002

*Attest:*

JAMES E. ROGAN
*Director of the United States Patent and Trademark Office*

*Attesting Officer*